United States Patent [19]

Depp et al.

[11] 4,306,951
[45] Dec. 22, 1981

[54] ELECTROCHEMICAL ETCHING PROCESS FOR SEMICONDUCTORS

[75] Inventors: Steven W. Depp; Kurt E. Petersen, both of San Jose, Calif.

[73] Assignee: International Business Machines Corporation, Armonk, N.Y.

[21] Appl. No.: 154,645

[22] Filed: May 30, 1980

[51] Int. Cl.³ .............................. C25F 3/12; C25F 3/14
[52] U.S. Cl. .............................. 204/129.3; 204/129.43
[58] Field of Search ............ 204/129.25, 129.3, 129.43

[56] References Cited

U.S. PATENT DOCUMENTS

| 3,179,543 | 4/1965 | Marcelis | 156/11 |
| 3,265,599 | 8/1966 | Soonpaa | 204/129.3 |
| 3,527,682 | 9/1970 | Valvo | 204/129.55 |
| 3,738,917 | 6/1973 | Spath | 204/15 |
| 3,962,052 | 6/1976 | Abbas et al. | 204/129.3 |
| 4,069,121 | 1/1978 | Baud et al. | 204/129.3 |
| 4,135,989 | 1/1979 | Pruett | 204/129.1 |
| 4,180,416 | 12/1979 | Brock | 204/129.3 X |

FOREIGN PATENT DOCUMENTS 1044289 11/1958 Fed. Rep. of Germany ... 204/129.3
1143273  2/1963 Fed. Rep. of Germany ... 204/129.3

OTHER PUBLICATIONS

Meek, R. J., J. Electrochemical Soc. 118, 1240 (1971).
Wen, C. P. and Keller, W. D., J. Electrochemical Soc. 119, 547 (1972).
van Kijk, H. J. A. and deJonge, J., Electrochemical Soc. 117, 553 (1970).

Primary Examiner—Delbert E. Gantz
Assistant Examiner—Donald R. Valentine
Attorney, Agent, or Firm—Joseph E. Kieninger

[57] ABSTRACT

A method of electrochemically etching a semiconductor to a predetermined contour includes positioning at least one electrode on one side of the semiconductor and then applying a voltage to the electrodes so as to generate a varying current density vertically through the semiconductor and thereby electrochemically etch the mask-free other side of the semiconductor.

3 Claims, 9 Drawing Figures

U.S. Patent  Dec. 22, 1981  Sheet 1 of 2  4,306,951
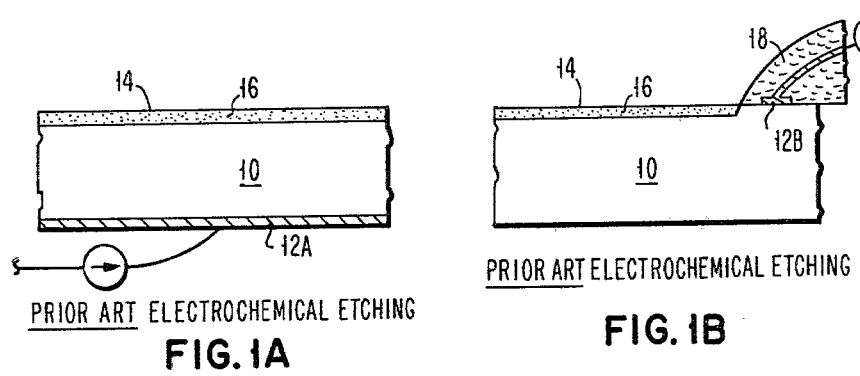
PRIOR ART ELECTROCHEMICAL ETCHING
FIG. 1A
PRIOR ART ELECTROCHEMICAL ETCHING
FIG. 1B
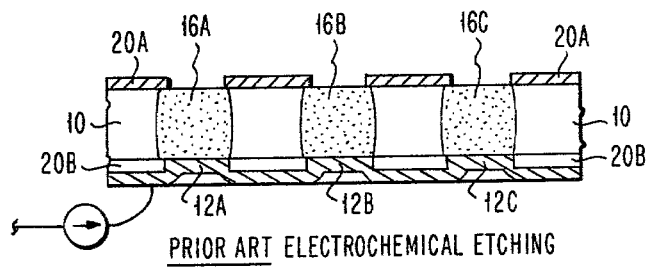
PRIOR ART ELECTROCHEMICAL ETCHING
FIG. 1C
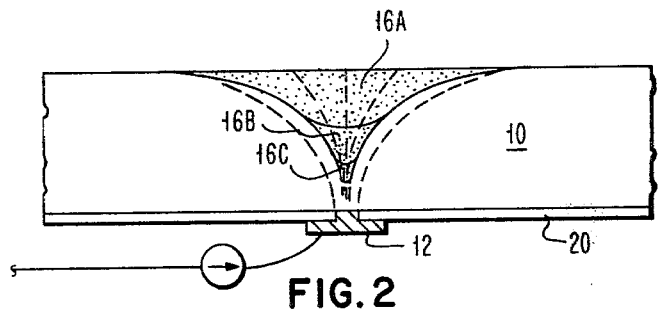
FIG. 2
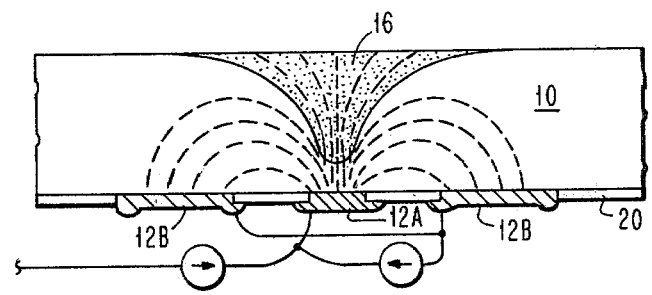
FIG. 3

ELECTROCHEMICAL ETCHING PROCESS FOR SEMICONDUCTORS

DESCRIPTION

1. Technical Field

This invention relates to etching methods and more particularly to an electrochemical method of etching semiconductors.

It is a primary object of this invention to provide an improved etching method.

It is another object of this invention to provide an improved electrochemical etching method.

It is still another object of this invention to provide an electrochemical etching method for obtaining a predetermined contour on a semiconductor.

It is a further object of this invention to provide an electrochemical etching method with a high degree of control over the pattern geometry, etch rate, etch depth and wall contour in the etched pattern.

2. Background Art

As the semiconductor silicon is exploited more and more for its mechanical properties, e.g., ink jet nozzles, fiber optic components, pressure transducers, silicon head technology and so forth, it is becoming clear that new etching techniques having a high degree of control and a high degree of versatility are required for accurately micromachining the silicon into the desired complex shapes. In silicon head technology, for example, it is desirable to have gradual slopes on the chip edges rather than the abrupt or sharp edges that are formed when the silicon wafers are cut. In some ink jet applications, for example, drop-on-demand, it is desirable to have gradually tapered, conical holes clear through the wafers. In thin film magnetic disk read/write heads, regions of the head surface which fly over the disk must be correctly beveled at an angle of several degrees to provide the proper aerodynamic lift. At the present there are no known etching techniques which can be applied in a batch-fabrication mode to form the required shapes described above.

Conventional etching techniques employed in silicon micromechanical device fabrication are chemical (isotropic and anisotropic), ion etching or milling and electrochemical. When these etching processes are combined with dopant-dependent etch rates, unique and useful patterns can be created. However, isotropic and anisotropic etching and ion milling permit only a limited fixed selection of edge or wall contours while electrochemical etching as employed in the literature so far is really only useful for thin film or substrate removal, silicon membrane fabrication, and uniform holes through wafers. In addition, the usefulness of the dopant-dependent etching is limited in micromechanical structures since gradual variations in doping level can be reasonably produced only over dimensions on the order of a few microns while the dimensional requirements of the applications suggested above are typically many tens or hundreds of microns.

FIGS. 1A, B and C show three typical schematics of how electrochemical etching has been performed in the past. Electrical contact to the silicon 10 is made either by a uniform electrode 12A on the bottom of the wafer 10 as shown in FIG. 1A or by an electrode 12B protected by, for example, black wax 18 attached to the top of the wafer 10 as shown in FIG. 1B. The bottom of the wafer 10 must also be suitably protected by, for example, black wax or a liquid-tight holder. The silicon wafer 10 is then immersed in a hydrofluoric acid (HF) containing etching solution while a current is drawn between the solution via a platinum electrode (not shown) and the cathode 12A or 12B. Etching of the surface 14 at the top of the wafer 10 occurs to etch away the material shown as layer 16.

An electrochemical etching process for forming holes with precisely controlled dimension and position in monocrystalline silicon wafers is described in the patent to Abbas et al, U.S. Pat. No. 3,962,052 and is shown in FIG. 1C. In this process the silicon wafer 10 has mask 20A on the top surface of the wafer 10 and a mask 20B on the bottom surface of silicon wafer 10. A plurality of electrodes 12A, 12B and 12C are positioned in the openings of the mask 20B at the bottom of the wafer 10. The regions 16A, 16B and 16C of the silicon wafer 10 are etched through the openings in the mask 20A while a current is passed through electrodes 12A, B and C to form the desired holes.

It is to be noted that in the electrochemical etching processes described in FIGS. 1A, B and C that the current density vertically through the etched regions is constant, that is, the current density at any point along a horizontal line in the region being etched is at the same value anywhere along the horizontal line. By maintaining a constant density vertically through the semiconductor, the rate of etching is uniform.

BRIEF DESCRIPTION OF THE DRAWINGS

In the accompanying drawings forming a material part of this disclosure:

FIGS. 1A, B and C are cross-sectional elevational views of a silicon wafer which illustrate the prior art electrochemical etching processes;

FIG. 2 is a elevational cross-sectional view of a silicon wafer being etched in accordance with this invention with a single electrode pattern;

FIG. 3 is an elevational cross-sectional view of a silicon wafer being etched in accordance with this invention using a first multiple electrode pattern;

DISCLOSURE OF THE INVENTION

Figure 4:
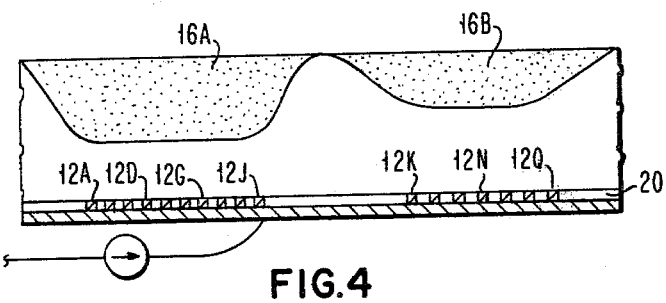
FIG. 4 is an elevational cross-sectional view of a silicon wafer being etched in accordance with this invention utilizing a second multiple electrode pattern.

For a further understanding of the invention and of the objects and advantages thereof, reference will be had to the following description and accompanying drawings, and to the appended claims in which the various novel features of the invention are more particularly set forth.

A method of electrochemically etching a semiconductor to a predetermined contour includes positioning at least one electrode on one side of the semiconductor and then applying a voltage to the electrode so as to generate a varying current density vertically through the semiconductor and thereby electrochemically etch the mask-free other side of the semiconductor. This method may employ one electrode or a plurality of electrodes to etch patterns in silicon with a high degree of control over pattern geometry, etch rate, the etch depth and the contours of the walls of the etched pattern. The shaping of the etched pattern is influenced by varying the number of electrodes, the spacing between the electrodes as well as the polarity, magnitude and time dependence of the current passed through the individual electrodes.

BEST MODE FOR CARRYING OUT THE INVENTION

As shown in FIG. 2, the bottom of the semiconductor wafer 10 of suitable resistivity and type is covered by an insulating layer 20, for example, $SiO_2$, $Si_3N_4$ and the like. Semiconductor materials suitable for etching with this process are silicon, germanium, gallium arsenide and gallium phosphide with the preferred semiconductor material being silicon. A hole is etched through the insulating layer 20 and an aluminum layer is deposited on the silicon wafer 10 through this hole to form the electrode 12. The wafer 10 is immersed in an etching solution containing HF keeping the metallization suitably protected from the etch solution, and a voltage is applied to the electrode to etch the portion 16A of wafer 10. The current density within the silicon wafer 10 will correspond to a cone shaped pattern as shown in this figure and etching will occur at a rate dependent on the local current density at the silicon/solution interface. This current density is greatest directly above the contact and decreases as the distance increases away from this point. The silicon will be etched away in a crater 16A having very gradually sloping walls. As etching proceeds into the wafer 10, the current density at the silicon/solution interface which is advancing into the sample is increasing with time. The silicon/solution interface advances faster and faster toward the electrode 12. If the current passing through the circuit is decreased by an operator at a specified rate, the current density in the center of the hole can be more nearly maintained constant and the current at the periphery will decrease faster than at the center. When the current is decreased in this manner, the contour of the etched hole will be more abrupt as shown by area 16B and 16C.

As shown in FIG. 3 an additional annular electrode 12B is positioned in spaced relation around electrode 12A. Electrode 12B can be biased to redistribute the field lines and effectively reduce or lower the amount of current from the primary etching electrode 12A. The redistribution of current density due to the presence of the counter electrode 12B can be used to program the contours of the etched holes by varying the relative intensities of the currents applied to electrodes 12A and 12B with time.

The versatility of these electrochemical etching techniques suggests a variety of structures and applications. As shown in FIG. 4 the electrodes 12A through 12Q made from two-dimensional arrays of dots or lines with features much smaller than the wafer thicknesses can be used to etch cavities and depths dependent upon the density of the actual electrode 12A–Q contact area. Cavities of several different depths can even be etched during a single etching step. The ten electrodes 12A through 12J cause the cavity 16A to be etched in the wafer 10 to a specified depth, whereas seven electrodes 12K through 12Q cause the cavity 16B to be etched to a depth shallower than 16A. It is noted that electrodes 12A through 12Q are connected together so that they are at a common voltage. In FIG. 4 the cavities 16A and 16B are unconnected at the surface.

Figure 5:
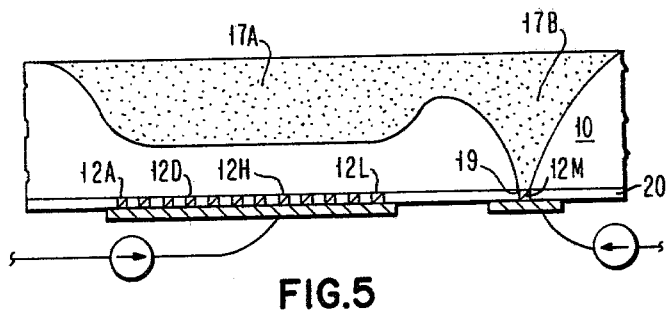
FIG. 5 is an elevational cross-sectional view of a silicon wafer being etched in accordance with this invention utilizing a third multiple electrode pattern.

The capability of programming contours of holes etched through silicon wafers suggests many applications in ink jet technologies. FIG. 5 illustrates a possible configuration for a drop-on-demand ink jet orifice 19 at the end of cavity 17B together with the ink cavity 17A. An arbitrary shaped cavity 17A has been etched partially through the wafer 10 with one circuit with electrodes 12A through 12L. During the same etching step, but in a different circuit and applying a different voltage to electrode 12M, a hole is also etched completely through the wafer. It is also possible to use any or all of the current density control methods described above to obtain the desired contour. The hole 17B is positioned near the cavity 17A so that the two etched patterns 17A and 17B interfere and overlap as shown in the drawing. A deformable pump membrane (not shown) bonded to the top surface of the wafer 10 with a piezoelectric crystal (not shown) mounted over the cavity region 17A will complete this drop-on-demand nozzle design.

Figure 6:
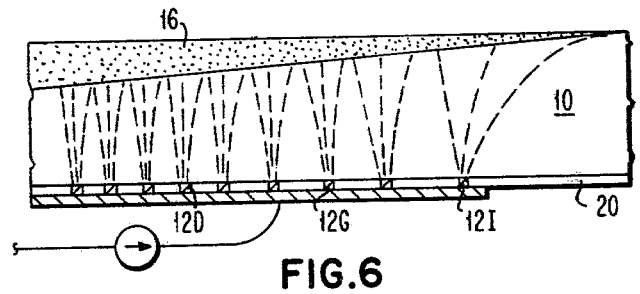
FIG. 6 is an elevational cross-sectional view of a silicon wafer being etched in accordance with this invention utilizing a fourth multiple electrode pattern.

A very gradually tapered top surface as shown in FIG. 6 can be etched in a wafer 10 by removing the material 16. This can be effected by adjusting the electrode density 12A through 12I with the proper spacing as shown on the bottom surface. The electrodes 12A through 12D, where more etching is desired, are more closely spaced than the electrodes 12G through 12I where a larger amount of spacing is required to obtain a smaller etch rate. A tapered region formed by removing material 16 would be of value, for example, in implementing the aerodynamic lifting surface required in magnetic disk read/write heads.

Figure 7:
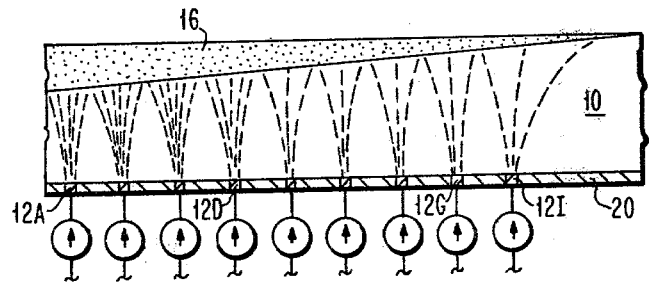
FIG. 7 is an elevational cross-sectional view of a silicon wafer being etched in accordance with this invention utilizing a fifth multiple electrode pattern.

The tapered structure shown in FIG. 6 can also be obtained by placing the electrodes 12A through 12I equidistant from each other and by applying separate voltages or current to each electrode as shown in FIG. 7. To obtain the tapered structure the voltage applied to electrode 12A would be greater than the voltage applied to electrode 12B which in turn is greater than the voltage applied to electrode 12C and so forth. Hence, the tapered structure shown in FIGS. 6 and 7 can be obtained by either the proper spacing of the electrodes and/or by applying different voltages to the individual electrodes.

In other potential silicon head applications, it is desirable to gradually smooth the edges all around one side of the chip. Such rounded edges would alleviate chipping of the silicon head under conditions of wear, and limit damage to the moving media such as magnetic tape, resistive ribbon or paper. These rounded edges can be generated simply by dicing up the wafer using controlled electrochemical etching with a grid-shaped electrode on the bottom of the wafer. This procedure permits a high degree of control and versatility in etching patterns in semiconductors and in the contours of the etched holes. A large number of potential applications other than those described here seem likely.

While we have illustrated and described the preferred embodiments of our invention, it is understood that we do not limit ourselves to the precise constructions disclosed and the right is reserved to all changes and modifications coming within the scope of the invention as defined in the appended claims.

We claim:

1. A method of electrochemically etching a semiconductor wafer to a predetermined contour comprising the steps of:

(a) positioning an electrode pattern containing at least two electrodes in spaced relation on the first side of the semiconductor, and (b) applying a voltage to said pattern whereby the current density is varied vertically through the wafer by the spacing of the electrodes in said pattern and thereby electrochemically etch the mask-free second side of the semiconductor.

2. A method of electrochemically etching a semiconductor wafer to a predetermined contour comprising the steps of:

(a) positioning an electrode pattern containing at least two electrodes in spaced relation on the first side of the semiconductor, and (b) applying different polarities and magnitudes of voltages to different electrodes in said pattern so as to generate a varying current density vertically through the wafer and thereby electrochemically etch the mask-free second side of the semiconductor.

3. A method as described in claim 2 whereby the current density is varied vertically through the wafer by applying different polarities and magnitudes of voltages to the electrodes with time.

* * * * *

Disclaimer 4,306,951.—*Steven W. Depp* and *Kurt E. Petersen*, San Jose, Calif. ELECTROCHEMICAL ETCHING PROCESS FOR SEMICONDUCTORS. Patent dated Dec. 22, 1981. Disclaimer filed Apr. 24, 1986, by the assignee, *International Business Machines Corp.*

Hereby enters this disclaimer to claims 1, 2 and 3 of said patent.
[*Official Gazette July 8, 1986.*]